United States Patent
Nishizawa (12)

(10) Patent No.: US 6,498,705 B1
(45) Date of Patent: Dec. 24, 2002

(54) ELECTRICAL CONNECTION ARRANGEMENT FOR A MAGNETIC HEAD OF A FLOPPY DISK DRIVE

(75) Inventor: Hiroshi Nishizawa, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 51 days.

(21) Appl. No.: 09/585,133

(22) Filed: Jun. 1, 2000

(30) Foreign Application Priority Data

Jun. 2, 1999 (JP) ............................. 11-155541

(51) Int. Cl.⁷ ................................................. G11B 5/48
(52) U.S. Cl. .................................. 360/266.3; 360/245.8
(58) Field of Search ........................ 360/266.3, 264.2, 360/245.8, 245.9

(56) References Cited

U.S. PATENT DOCUMENTS 5,305,167 A * 4/1994 Nagase et al. ............ 360/266.3
5,914,834 A * 6/1999 Gustafson ................ 360/245.9
5,995,325 A * 11/1999 Maggio et al. ............. 360/104
6,023,029 A * 2/2000 Armezzani et al. ......... 174/260
6,163,443 A * 12/2000 Hatagami et al. ........... 360/323

FOREIGN PATENT DOCUMENTS

JP 9-139039 5/1997

* cited by examiner

Primary Examiner—Jefferson Evans
(74) Attorney, Agent, or Firm—Pearne & Gordon LLP

(57) ABSTRACT

A floppy disk drive comprising a magnetic head, a flexible printed circuit, and a plurality of connecting lands. The magnetic head is adapted to move in a radial direction of a recording medium which is rotated by a spindle motor for recording and reproducing an information on and from the recording medium. The flexible printed circuit is provided on a carrier for moving the magnetic head. The plurality of connecting lands is provided on the flexible printed circuit for respective lead wires which have been drawn out from the magnetic head. The connecting lands are apart from each other and located in a direction where the lead wires are drawn from the magnetic head and the connecting lands are electrically connected to each other. End portions of the lead wires are selectively connected to the connecting lands.

5 Claims, 5 Drawing Sheets

ELECTRICAL CONNECTION ARRANGEMENT FOR A MAGNETIC HEAD OF A FLOPPY DISK DRIVE

BACKGROUND OF THE INVENTION

1. Field of the Invention

This invention relates a floppy disk drive which can be employed as an peripheral recording device for a computer or the like.

2. Description of the Related Art

A floppy disk drive of this type has been known from Japanese Patent Publication No. JP-A-9-139039.

In the floppy disk drive disclosed in the above described publication, a thin leaf spring-like load arm and an arm for supporting the load arm are integrally formed in the same substrate of a thin plate, and ribs are formed on the supporting arm by plastic working so as to give a rigidity to the supporting arm which supports a magnetic head. With this arrangement, coils of the magnetic head attached to a distal end of the supporting arm are drawn out and extended toward a base end thereof along the supporting arm and connected to a flexible print circuit or flexible printed circuit (FPC) provided on the base end area of the supporting arm by soldering.

When the lead wires drawn from the magnetic head, that is, lead wires of the coils, are soldered to the FPC, the lead wires are cut in a desired length, and end portions of the lead wires are soldered to connecting lands provided on the FPC by preliminary soldering while removing coatings on the end portions with heat of a soldering iron.

However, in case where with respect to each of the lead wires of the magnetic head attached to the distal end of the supporting arm is provided only one connecting land on the FPC to which the lead wire is adapted to be connected, there occurs a so-called copper loss that the copper dissolves in solder by the heat and the lead wire will become thin. As a result, because the end portion of the lead wire is broken and becomes too short, it will be impossible to connect the lead wire to the connecting land.

Conventionally, the relevant magnetic head has been disposed of in such cases. Accordingly, there have been such inconveniences as yields of the magnetic heads become poor, and it has been uneconomical to dispose of the expensive magnetic heads.

SUMMARY OF THE INVENTION

This invention has been made in order to improve such inconveniences in the prior art, and it is an object of the present invention to provide a floppy disk drive in which a magnetic head can be reused without being disposed of, even though the lead wire is broken and becomes short when the end portion of the lead wire is connected to the connecting land on the FPC, and to achieve an improvement in the yields of the magnetic heads and cost cutting of the floppy disk drive.

In order to attain the above described objects, a plurality of connecting lands are provided on the FPC for the respective lead wires. The connecting lands are apart from each other in a direction of extension of the lead wires, so that each of the lead wires can be connected to the connecting land which is closer to the magnetic head, even though the lead wire is broken and becomes shorter in length at the time of connection. Thus, an amount of the magnetic heads to be disposed of due to the breakage of the lead wire will be reduced, and the yields of the magnetic heads will be enhanced. At the same time, production of the floppy disk drive will become more economical because the expensive magnetic heads can be reused.

DETAILED DESCRIPTION OF THE PREFERRED EMBODIMENT

Figure 1:
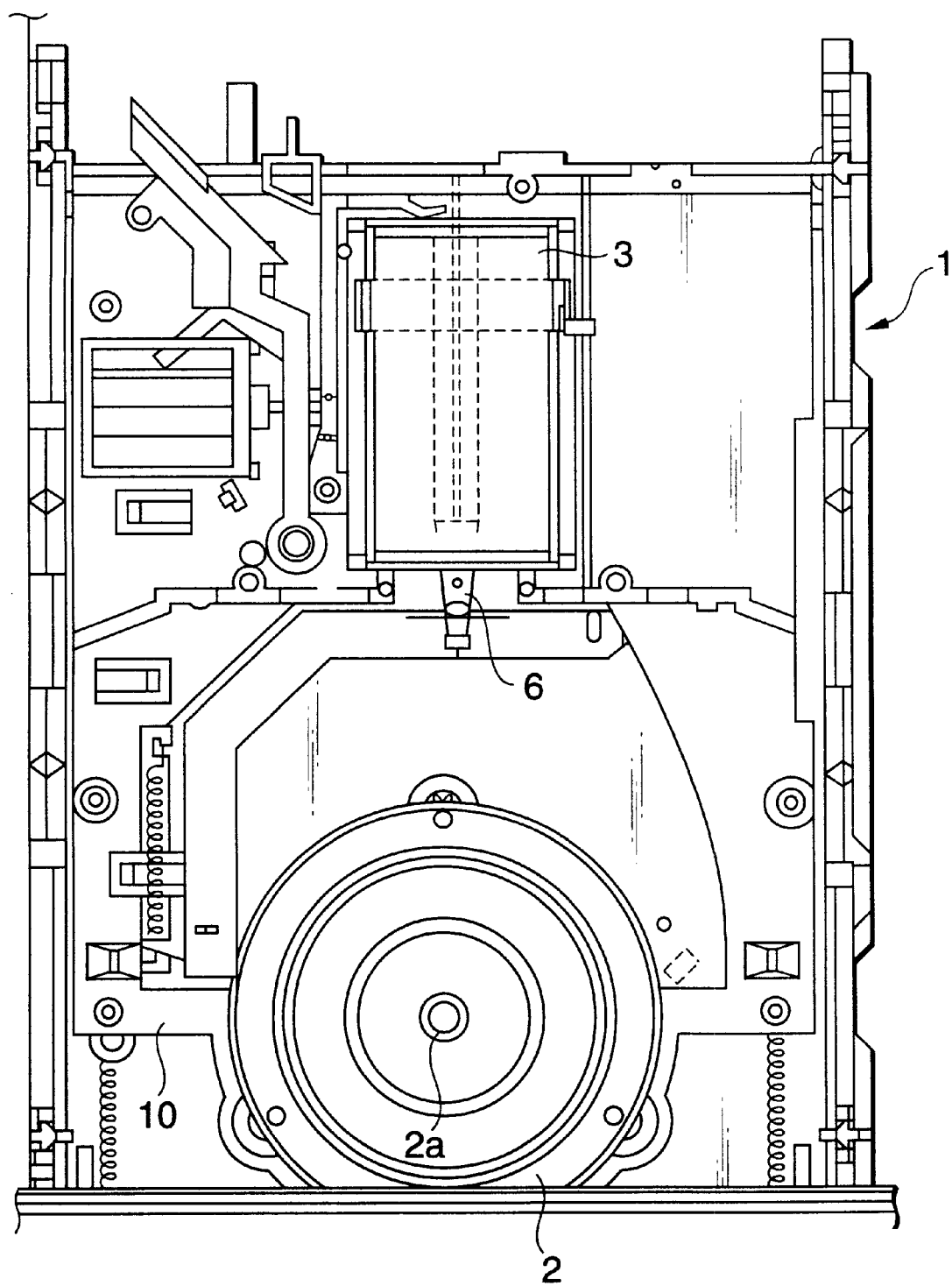
FIG. 1 is a plan view showing an essential part of a floppy disk drive according to an embodiment of the present invention.

The first aspect of the present invention is embodied by a floppy disk drive which comprises a magnetic head adapted to move in a radial direction of a recording medium which is rotated by a spindle motor for recording and reproducing an information on and from the recording medium, characterized in that the device further comprises an FPC provided on a carrier for moving the magnetic head, and a plurality of connecting lands provided on the FPC for respective lead wires of coils, which have been drawn out from the magnetic head, the connecting lands being apart from each other in a direction where the lead wires are drawn from the magnetic head and electrically connected with each other, end portions of the lead wires being selectively connected to the connecting lands.

With the above described structure, even though the lead wire grows short by applying too much heat to the end portion of the lead wire when the coating on the end portion of the lead wire is removed by the heat or when the lead wire is connected to the connecting land, the magnetic head need not be disposed of but can be reused by connecting the end portion of the lead wire to the connecting land which is closer to the magnetic head. Accordingly, the yields of the magnetic heads will be enhanced and the production will be carried out in an economical manner because the expensive magnetic heads need not be disposed of.

According to the second aspect of the present invention, each lead wire is formed of copper having a diameter of 40 $\mu$m or less.

The above described structure is particularly effective in applying to a floppy disk drive in which the wires having smaller diameter magnet lead wire are employed in the magnetic head, such as a large capacity floppy disk drive. Further, the magnetic head will have more allowance for windings of the wires by employing the lead wires having the fine core wires in the magnetic head, and so, the magnetic head can be reduced in size and weight.

According the third aspect of the present invention, the end portions of the lead wires are soldered to the connecting lands employing a soldering paste added with copper.

The above described structure will greatly reduce the copper loss caused by melting of the copper when the lead wire is soldered.

Now, an embodiment of the present invention will be described referring to the drawings.

Figure 2:
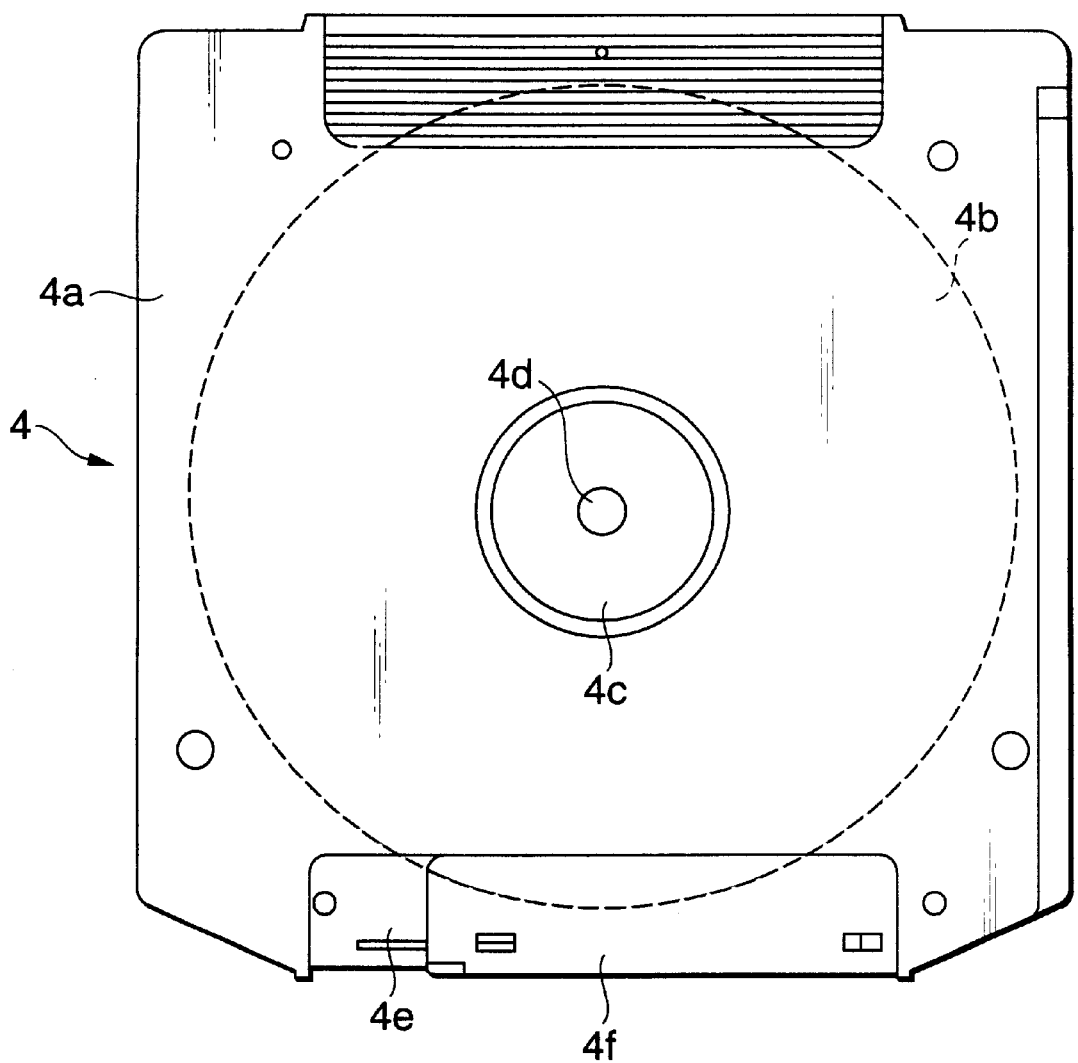
FIG. 2 is a drawing showing an outside drawing of a recording medium which is used in the floppy disk drive according to the embodiment of the present invention.
Figure 3:
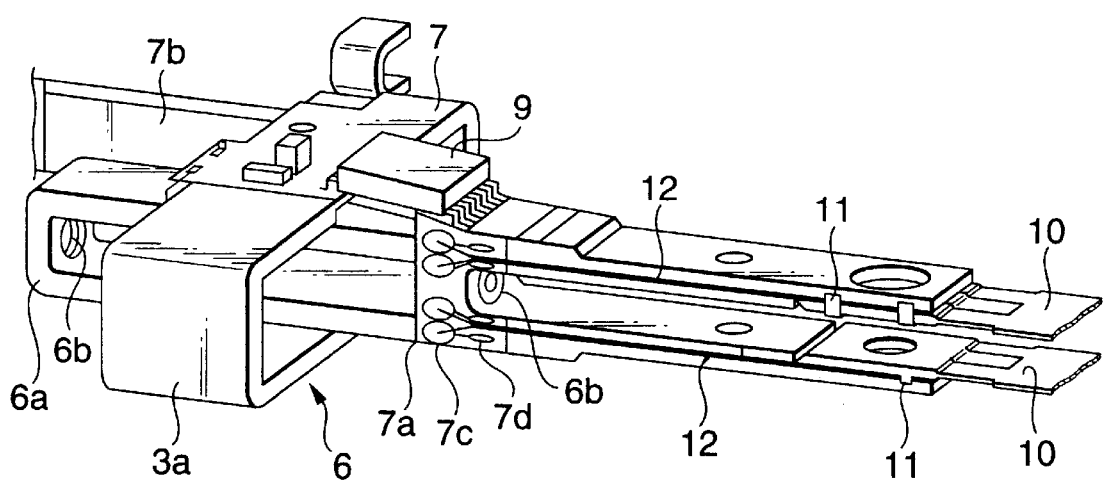
FIG. 3 is a perspective view of a magnetic head assembly which is used in the floppy disk drive according to the embodiment of the invention.
Figure 4:
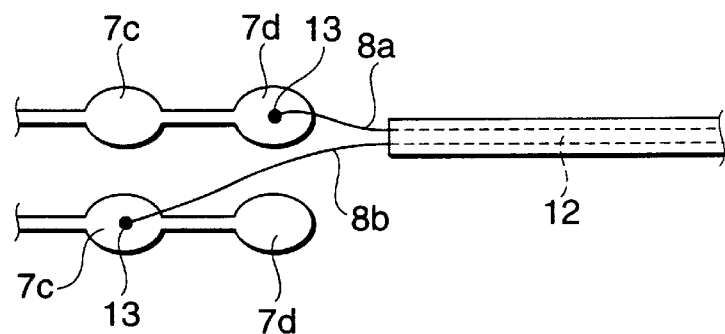
FIG. 4 is an enlarged view of a connecting part of lead wires in the floppy disk drive according to the embodiment of the present invention.
Figure 5:
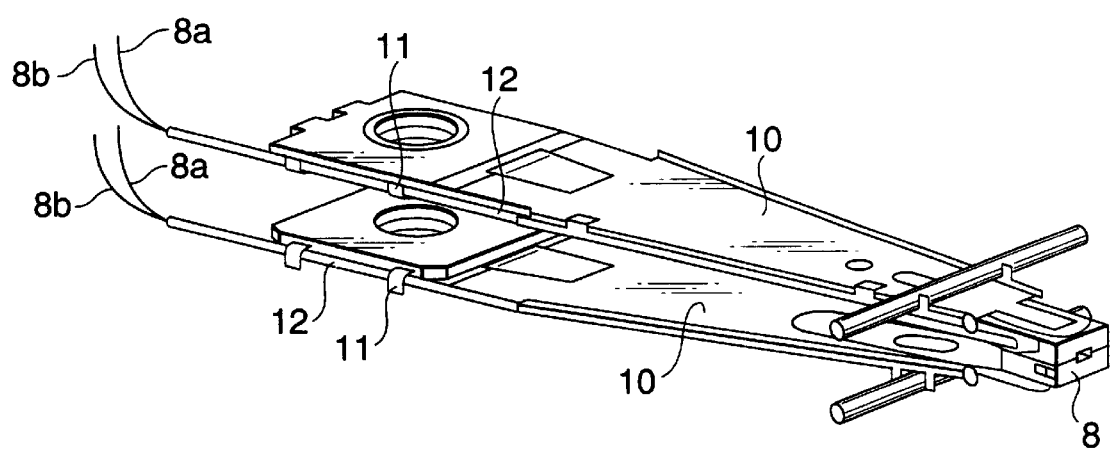
FIG. 5 is a perspective view of a head gimbal assembly which is used in the floppy disk drive according to the embodiment of the present invention.
Figure 6:
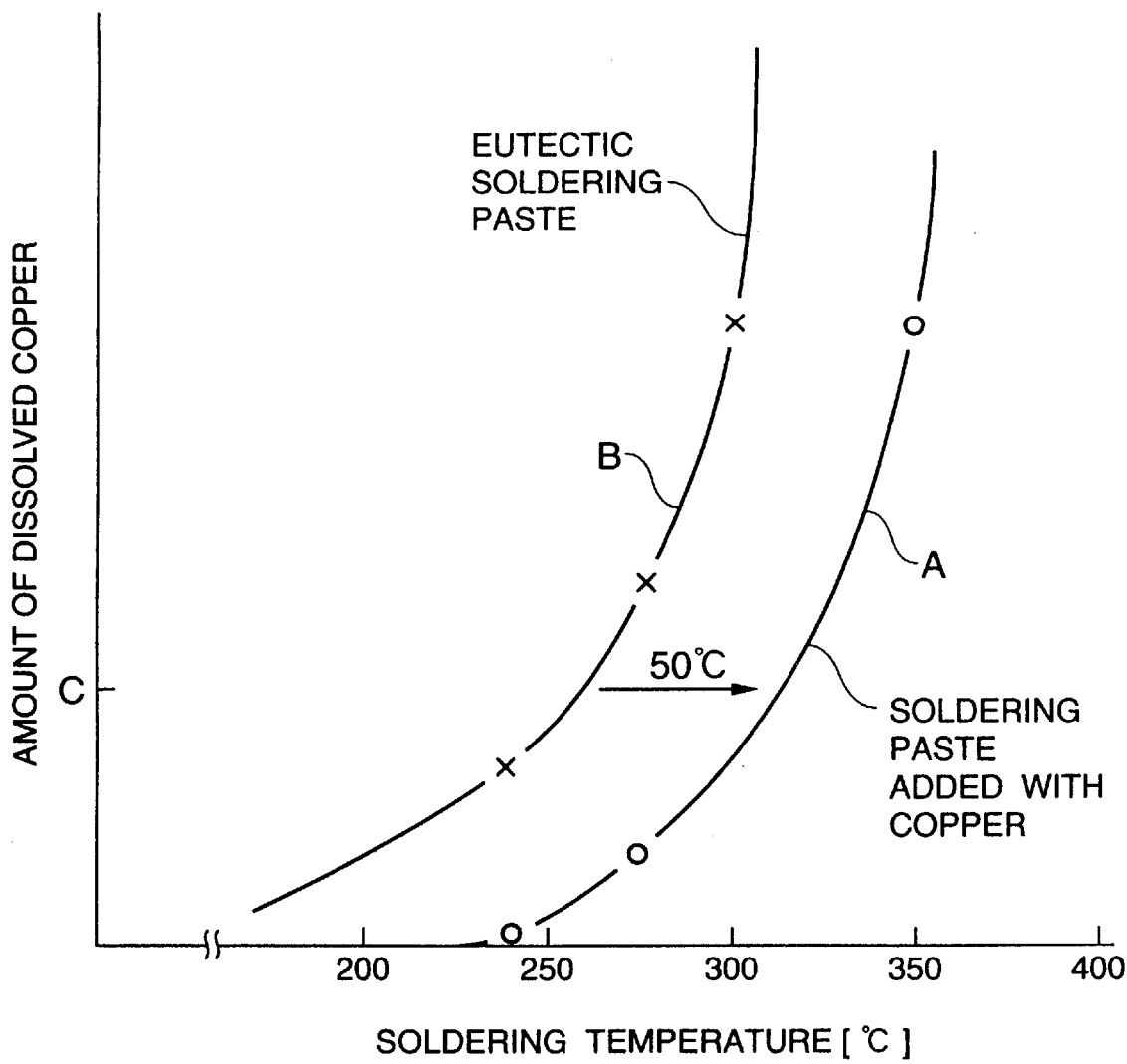
FIG. 6 is a diagram showing a relation between an amount of the copper dissolved in solder during the soldering process of the lead wire and the soldering temperature.

FIG. 1 is a plan view showing an essential part of a floppy disk drive according to an embodiment of the present invention, FIG. 2 is a drawing showing an outside of a recording medium (floppy disk) which is used in the floppy disk drive, FIG. 3 is a perspective view of a magnetic head assembly (HSA), FIG. 4 is an enlarged view of a connecting part of lead wires, FIG. 5 is a perspective view of a head gimbal assembly (HGA), and FIG. 6 is a diagram showing a relation between an amount of the copper melted out during the soldering process of the lead wire and soldering temperature.

In FIG. 1, numeral 1 designates a device body having a spindle motor 2 which rotates a recording medium 4. A spindle shaft 2a of the spindle motor 2 is adapted to engage with an engaging hole 4d formed in the recording medium 4.

Numeral 3 designates a voice coil motor for moving the a magnetic head 8 in a radial direction of the recording medium 4 (toward a concentric track) for enabling the magnetic head 8 to record an information on a determined track in the recording medium 4 or reproduce the information.

The recording medium 4 illustrated in FIG. 2 has a case 4a in a substantially square shape, and a magnetic recording disk 4b rotatably encased in the case 4a. A core metal 4c fixed to a central part of the magnetic recording disk 4b is formed at its central-part with an engaging hole 4d with which the spindle shaft 2a of the above described spindle motor 2 is adapted to engage.

In a part of the case 4a is formed an opening 4e through which the magnetic head 8 is brought into contact with the track on the magnetic recording disk 4b. To this opening 4e is fitted a shutter 4f so as to be opened and closed to shut the opening 4e by means of an action of spring (not shown) or the like, when the recording medium 4 is withdrawn from the device body 1, thereby preventing the recording medium 4 from being contaminated by dust or the like entering into the case 4a.

A magnetic head assembly 6 illustrated in FIG. 3 has a carrier 6a which is fixed to a coil 3a of the voice coil motor 3 and adapted to move toward the track on the recording medium 4 by means of the voice coil motor 3.

The carrier 6a serves as a base member of the magnetic head assembly 6 and is formed of an extruded material having a light weight and rigidity such as aluminum in a substantially U-shape. The carrier 6a is provided at its both ends with bearing members 6b formed of a material having abrasion resistance such as zirconia. These bearing members 6b are slidably supported by a guide rod (not shown) for helping the carrier 6a to move toward the track on the recording medium 4 smoothly and with high accuracy.

The carrier 6a is provided with an FPC 7 which has an electric circuit formed on a base film of polyimide.

The above described FPC 7 includes a magnetic head connecting portion 7a provided at a side face of the carrier 6a and a guide portion 7b for connecting the FPC 7 to a main circuit (not shown) of the device body 1. As shown in FIG. 4, the magnetic head connecting portion 7a includes a plurality of, two for example, connecting lands 7c, 7d which are apart from each other in a direction where a pair of lead wires 8a, 8b are drawn out from the magnetic head 8 and electrically connected to each other, respectively for the lead wires 8a, 8b.

In FIG. 3, numeral 9 designates a head amplifier mounted on the FPC 7 for amplifying an small input signal reproduced by the magnetic head without a decrease of S/N.

On the other hand, base ends of a pair of supporting arms 10 which are vertically apart from each other are fixed to the carrier 6a.

To distal ends of the supporting arms 10 is fitted the magnetic head 8 as shown in FIG. 5.

The lead wires 8a, 8b are drawn out from the magnetic head 8 and extended along both sides of the respective supporting arms 10.

Each of the lead wires 8a, 8b is formed by insulation coating a core wire made of copper having a diameter of about 20 $\mu$m or less, for example, with a polyurethane coating therearound. The lead wires are respectively passed through protective tubes 12 of a Teflon for further protection. The protective tubes 12 are fixed to both side edges of the supporting arms 10 by means of a plurality of clamps 11.

The lead wires 8a, 8b which have been extended up to the base ends of the supporting arms 10 are cut in a desired size, and then soldered to the connecting land 7c or 7d of the magnetic head connecting portion 7a with a soldering paste 13 added with copper.

Now, an assembling operation of the floppy disk drive which is constructed as described above will be explained.

The lead wires 8a, 8b drawn out from the magnetic head 8 which is fitted to the distal end of the supporting arms 10 are passed through the protective tubes 12 and fixed at intermediate positions to the opposite sides of the supporting arms 10 by means of the clamps 11.

The lead wires 8a, 8b drawn out of the protective tubes 12 are cut in a desired size. Then, coatings on the end portions of the lead wires 8a, 8b are removed with the aid of heat of a soldering iron and solder. The end portion is then soldered to one connecting land 7c of the two connecting lands 7c, 7d which is more remote from the magnetic head 8 by using the soldering paste added with copper.

In this embodiment, the soldering iron manufactured by Weller Inc. in the United States (WECP-20) has been employed to remove the coatings on the lead wires 8a, 8b at a temperature of 320° C. measured at a tip of the soldering iron, and after about five seconds, the end portions of the lead wires 8a, 8b are soldered to the connecting land 7c. However, the temperature and time at the soldering can be appropriately selected according to material of the lead wires and the soldering paste to be employed.

FIG. 6 shows a relation between the soldering temperature and an amount of the copper dissolved out from the lead wires 8a, 8b into solder.

In FIG. 6, a curve A shows a result of the embodiment according to this invention in which the lead wires 8a, 8b have been soldered by employing the soldering paste added with copper. For the sake of comparison, a curve B shows a case where the lead wires 8a, 8b have been soldered employing an eutectic soldering paste of 60% Sn to which copper is not added.

As apparent from the diagram, the amount of the melted copper can be reduced in case where the soldering paste added with copper is employed to solder the lead wires 8a, 8b. Accordingly, the so-called copper loss from the lead wires 8a, 8b can be substantially reduced.

With a rise of the soldering temperature, the copper loss will increasingly proceed. Provided that a point C in FIG. 6 shows an allowable amount of the copper loss, there will remain an allowance of 502 C. by employing the soldering paste added with copper. This means that the soldering work can be conducted at a higher temperature, and at the same time, the soldering work can be conducted for a longer period provided that the temperatures are the same. Therefore, the present invention can attain such effects as the temperature of the soldering iron can be easily managed.

As described above, the end portions of the lead wires 8a, 8b are soldered to the connecting lands 7c by employing the soldering paste added with copper to complete the assembling work of the magnetic head 8. It has been a conventional manner for the magnetic head 8 to be disconnected from the supporting arms 10 and disposed of, in case where the end portions of the lead wires 8a, 8b are broken and do not reach the connecting lands 7c to be soldered, because too much time has been taken, due to unskillfulness of a worker in the soldering work, to remove the coatings on the end portions of the lead wires 8a, 8b and then, to do the soldering work.

However, according to the present invention, the end portions of the lead wires 8a, 8b may be soldered to the connecting land 7d which is closer to the magnetic head 8. Thus, the magnetic head 8 need not be disposed of but can be reused, and the yields of the expensive magnetic heads can be substantially improved.

Moreover, the temperature of the soldering iron to be employed for the soldering is practically set to be 300° C. or more considering the removal of the lead wires 8a, 8b. However, the temperature is not necessarily limited to the described degree.

As described in particular hereinabove, a plurality of the connecting lands which are apart from each other in the direction where the coils are drawn out from the magnetic head are provided for the respective coils. Therefore, even though lead wires of the coils grow short because too much heat has been applied when the coatings on the end portions of the lead wires are removed by the heat and when the end portions of the lead wires are connected to the connecting lands, the magnetic head need not be disposed of but can be reused by connecting the end portions of the lead wires to the connecting land which is closer to the magnetic head. Therefore, the yields of the magnetic heads will be improved, and also, the invention will attain such an advantage from an economical viewpoint as the expensive magnetic head need not be disposed of.

Further, since the lead wire is made of copper and has a diameter of 40 μm or less, this invention is particularly effective for a device in which the coils having a fine lead wire are employed in the magnetic head such as a large volume floppy disk drive. Because the coils having the fine wire are employed in the magnetic head, there will remain the allowance for winding of the wires in the magnetic head, and the magnetic head can be reduced in size and weight.

Thus, trackability of the magnetic head will be enhanced, and accordingly, speedups of the device can be realized.

Further, since the end portions of the lead wires are soldered to the connecting lands employing the soldering paste added with copper, the copper loss which occurs by melting of the copper at soldering the lead wires will be substantially reduced. This enables the soldering temperature and time to be easily managed, and decreases occurrence of defective products caused by the breakage of the lead wires, whereby reliability of the products will be increased.

While only a certain embodiment of the invention has been specifically described herein, it will be apparent that numerous modifications may be made thereto without departing from the spirit and scope of the invention.

The present invention is based on Japanese Patent Application No. Hei. 11-155541 which is incorporated herein by reference.

What is claimed is:

1. A floppy disk drive comprising:
   a magnetic head adapted to move in a radial direction of a recording medium which is rotated by a spindle motor for recording and reproducing an information on and from said recording medium;
   at least one lead wire which has been drawn out from said magnetic head;
   a flexible printed circuit provided on a carrier for moving said magnetic head; and
   at least two connecting lands provided on one end of said flexible printed circuit for the respective lead wire, said connecting lands located in a direction where said lead wire is drawn from said magnetic head, said connecting lands being apart from each other and electrically connected to each other such that the lead wire can be connected to either of said connecting lands, and an end portion of the lead wire being selectively connected to one of said connecting lands.

2. The floppy disk drive according to claim 1, wherein the lead wire 2 is made of copper, and has a diameter of 40 μm or less.

3. The floppy disk drive according to claim 2, wherein the end portion of the lead wire is soldered to one of said connecting lands employing a soldering paste added with copper.

4. The floppy disk drive according to claim 1, wherein the end portion of the lead wire is soldered to one of said connecting lands employing a soldering paste added with copper.

5. The floppy disk drive according to claim 1, wherein the connecting lands are spaced apart so that the one of the connecting lands is positioned to be connected to an original length of the lead wire drawn out from said magnetic head.

* * * * *

UNITED STATES PATENT AND TRADEMARK OFFICE
CERTIFICATE OF CORRECTION

PATENT NO. : 6,498,705 B1
DATED : December 24, 2002
INVENTOR(S) : Hiroshi Nishizawa et al.

It is certified that error appears in the above-identified patent and that said Letters Patent is hereby corrected as shown below:

Column 5,
Line 2, please delete "502 C", and insert therefor -- 50ºC --.

Column 6,
Line 40, please delete "wire 2 is", and insert therefor -- wire is --.

Signed and Sealed this

Thirty-first Day of August, 2004

JON W. DUDAS
*Director of the United States Patent and Trademark Office*